(12) United States Patent
Chu

(10) Patent No.: US 6,190,211 B1
(45) Date of Patent: Feb. 20, 2001

(54) ISOLATION DISPLACEMENT CONNECTOR

(75) Inventor: Max Chu, Taipei (TW)

(73) Assignee: Telebox Industries Corp., Taipei Hsien (TW)

( * ) Notice: Under 35 U.S.C. 154(b), the term of this patent shall be extended for 0 days.

(21) Appl. No.: 09/511,269

(22) Filed: Feb. 23, 2000

(51) Int. Cl.$^7$ .................................................. H01R 24/00
(52) U.S. Cl. ............................................ 439/676; 439/941
(58) Field of Search .................................... 439/676, 941, 439/76.1, 607, 395, 78, 85, 609, 610, 620, 638, 639, 67, 77, 651, 654

(56) References Cited

U.S. PATENT DOCUMENTS

| | | | |
|---|---|---|---|
| 5,310,363 | * | 5/1994 | Brownell et al. ..................... 439/676 |
| 5,326,284 | * | 7/1994 | Bohbot et al. ........................ 439/676 |
| 5,414,393 | * | 5/1995 | Rose et al. ........................... 439/676 |
| 5,864,089 | * | 1/1999 | Rainal ................................. 174/35 C |
| 6,023,200 | * | 7/2000 | Rhee ..................................... 439/941 |
| 6,089,923 | * | 7/2000 | Phommachanh ..................... 439/676 |

* cited by examiner

*Primary Examiner*—Khiem Nguyen
*Assistant Examiner*—J. F. Duverne
(74) *Attorney, Agent, or Firm*—Varndell & Varndell, PLLC

(57) ABSTRACT

An isolation displacement connector includes a housing, a base circuit board installed in the housing, a terminal holder mounted on the base circuit board, and a set of terminals respectively installed in the terminal holder and inserted through the base circuit board, the base circuit board having transverse rows of metal contact holes and longitudinal rows of metal contact holes, and conductors and sine wave circuits symmetrically arranged on top and bottom side walls thereof and respectively connected to the metal contact holes to reinforce induction strength and noise preventive power.

10 Claims, 5 Drawing Sheets

ISOLATION DISPLACEMENT CONNECTOR

BACKGROUND AND SUMMARY OF THE INVENTION

The present invention relates to an isolation displacement connector, and more specifically to the circuit arrangement on a base circuit panel for an isolation displacement connector, which reinforces induction strength and noise preventive power of the connector.

In the base circuit board of a prior art connector, signal lines 1A, 2A, 3A, 4A, 5A, 6A, 7A, 8A have a respective U-turn arranged relative to one another, forming a capacitive circuit to maintain electric equilibrium, and to eliminate series noises. The input ends 1B, 2B, 3B, 4B, 5B, 6B, 7B, 8B and output ends 1C, 2C, 3C, 4C, 5C, 6C, 7C, 8C of the signallines 1A, 2A, 3A, 4A, 5A, 6A, 7A, 8A are not arranged subject to a particular order. This circuit design complicates the installation of the signal lines. Because the induction strength between signal lines is less strong, the noise eliminating power of the circuit is low.

The present invention has been accomplished to provide a circuit design for a base circuit board for use in an isolation displacement connector, which eliminates the aforesaid drawbacks. According to the present invention, the base circuit board comprises transverse rows of metal contact holes and longitudinal rows of metal contact holes, conductors and sine wave circuits symmetrically arranged on top and bottom side walls thereof and respectively connected to the metal contact holes to reinforce induction strength and noise preventive power.

DETAILED DESCRIPTION OF THE PREFERRED EMBODIMENT

Figure 1:
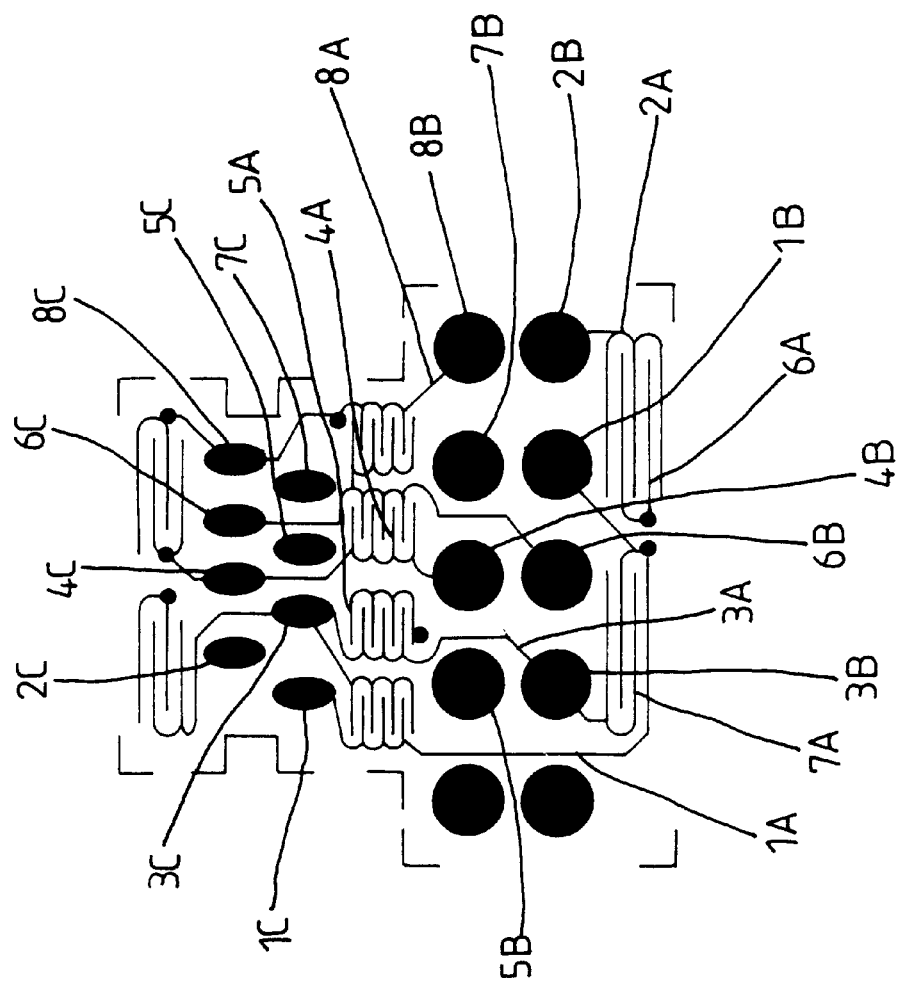
FIG. 1 illustrates the circuit arrangement of a base circuit borad for a prior art connector.
Figure 2:
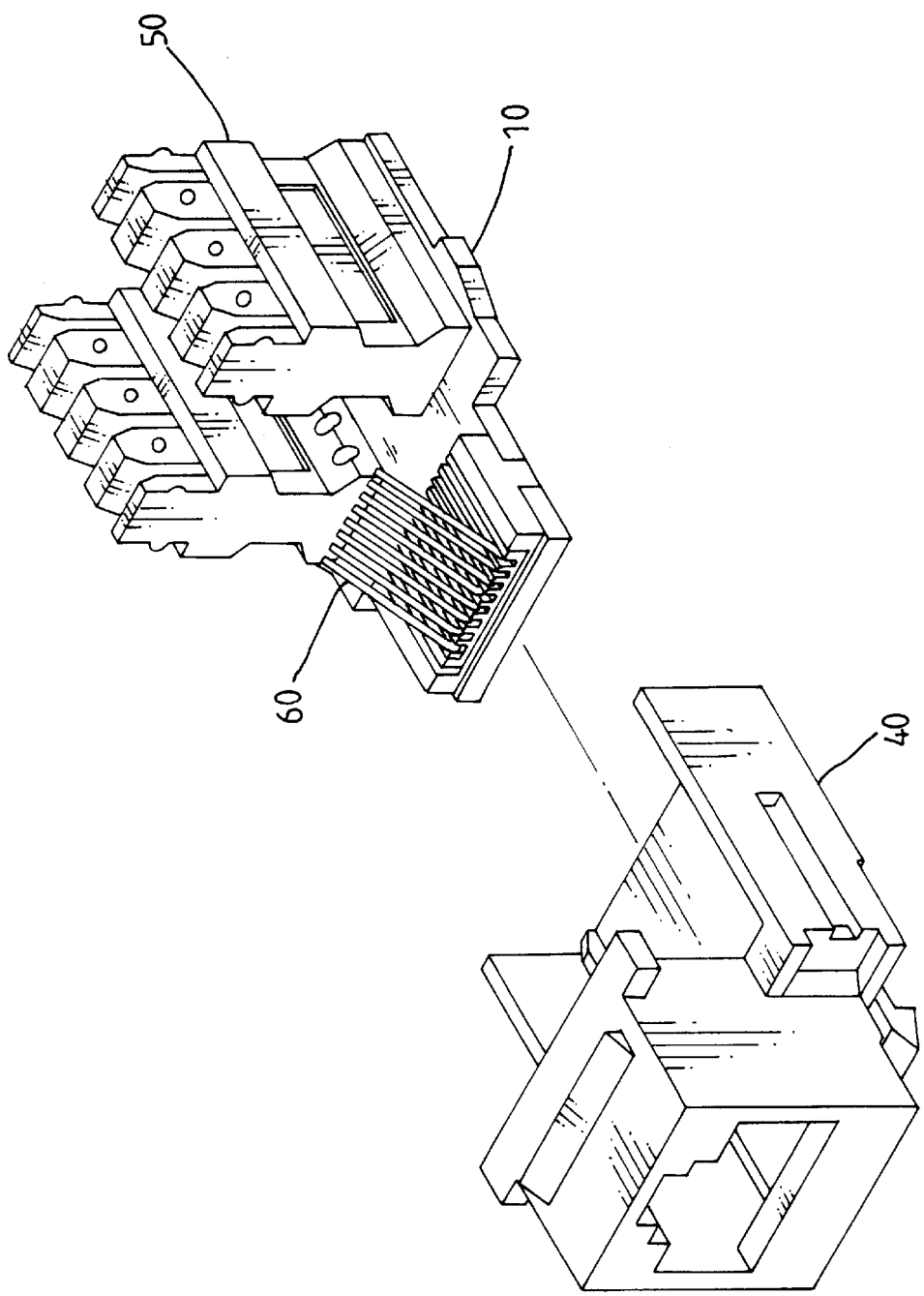
FIG. 2 is an exploded view of an isolation displacement connector according to the present invention.
Figure 3:
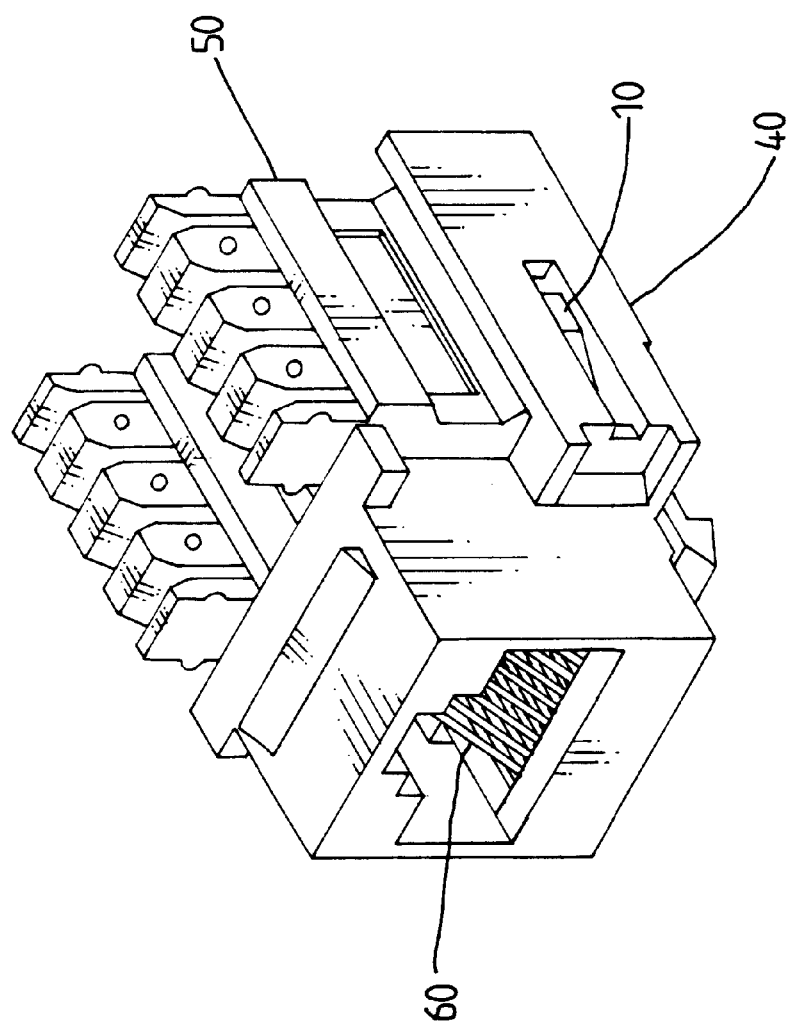
FIG. 3 is an assembly view of FIG. 2.

Referring to FIGS. 2 and 3, an isolation displacement connector in accordance with the present invention is generally comprised of a housing 40, a terminal holder 50, a base circuit board 10, and a set of terminals 60. The terminal holder 50 is fixedly mounted on the base circuit board 10, and installed with the base circuit board 10 in the housing 40. The terminals 60 are respectively installed in the terminal holder 50, and inserted through the base circuit board 10.

Figure 5:
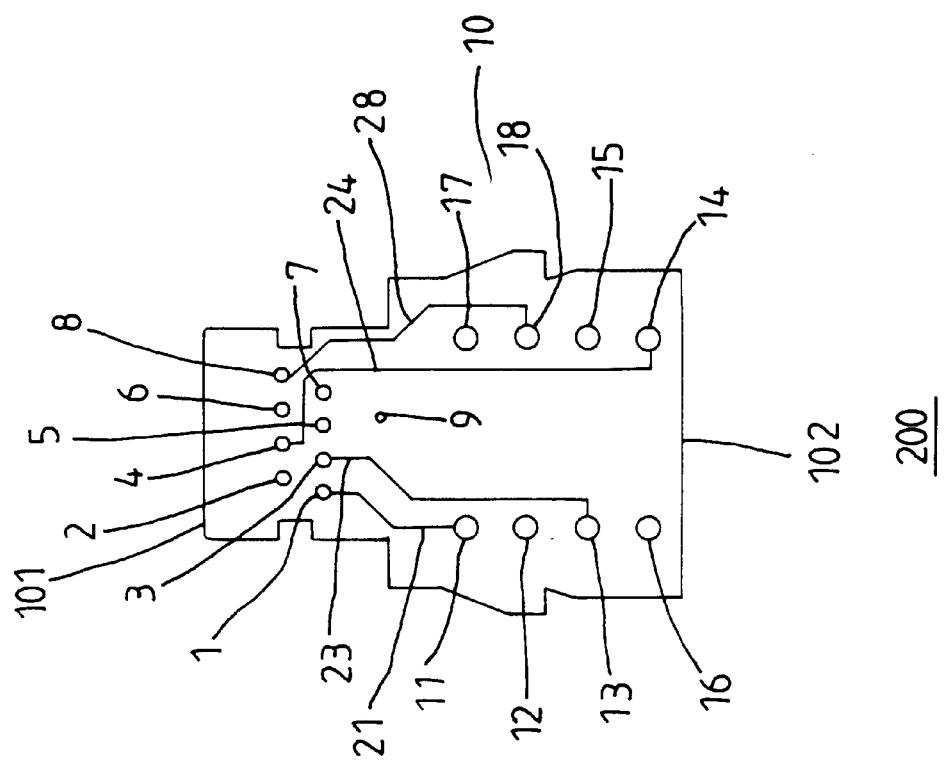
FIG. 5 illustrates the circuit arrangement at the second side of the base circuit board according to the first embodiment of the present invention.
Figure 4:
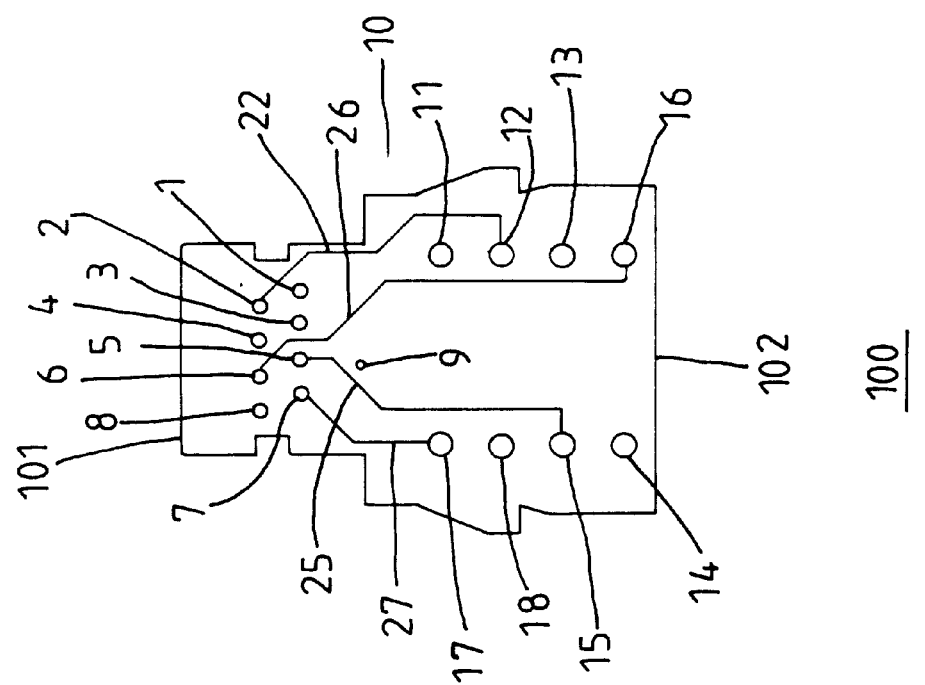
FIG. 4 illustrates the circuit arrangement at the first side of the base circuit board according to the first embodiment of the present invention.

Referring to FIGS. 4 and 5, the base circuit board 10 comprises a front part 101, a rear part 102, a first side 100, and a second side 200, an auxiliary metal contact hole 9 on the middle between the front part 101 and the rear part 102, two transverse rows of metal contact holes 1, 3, 5, 7,; 2, 4, 6, 8 arranged on the front part 101 and extended through the first side 100 and the second side 200, two longitudianl rows of metal contact holes 11, 12, 13, 16; 17, 18, 15, 14 arrangement on the rear part 102 and extended through the first side 100 and the second side 200, and a plurality of conductors 21, 22, 23, 24, 25, 26, 27, and 28. The conductors, 22, 25, 26, and 27 are printed on the first side 100. The conductors 21, 23, 24, and 28 are printed on the second side 200. The conductor 21 is connected between the metal contact hole 1 and the metal contact hole 11. The conductor 22 is connected between the metal contact hole 2 and the metal contact hole 12. The conductor 23 is connected between the metal contact hole 3 and the metal contact hole 13. The conductor 24 is connected between the metal contact hole 4 and the metal contact hole 14. The conductor 25 is connected between the metal contact hole 5 and the metal contact hole 15. The conductor 26 is connected between the metal contact hole 6 and the metal contact hole 16. The conductor 27 is connected between the metal contact hole 7 and the metal contact hole 17. The conductor 28 is connected between the metal contact hole 8 and the metal contact hole 18. Further, the conductor 21 and the conductor 22 are respectively disposed on the second side 200 and the first side 100, and arranged in parallel to reinforce relative induction strength and noise preventive power. The conductor 23 and the conductor 26 are respectively disposed on the second side 200 and the first side 100, and arranged in parallel to reinforce relative induction strength and noise preventive power. The conductor 24 and the conductor 25 are respectively disposed on the second side 200 and the first side 100, and arranged in parallel to reinforce relative induction strength and noise preventive power. The conductor 28 and conductor 27 are respectively disposed on the second side 200 and the first side 100, and arrangement in parallel to reinforce relative induction strength and noise preventive power.

Figure 7:
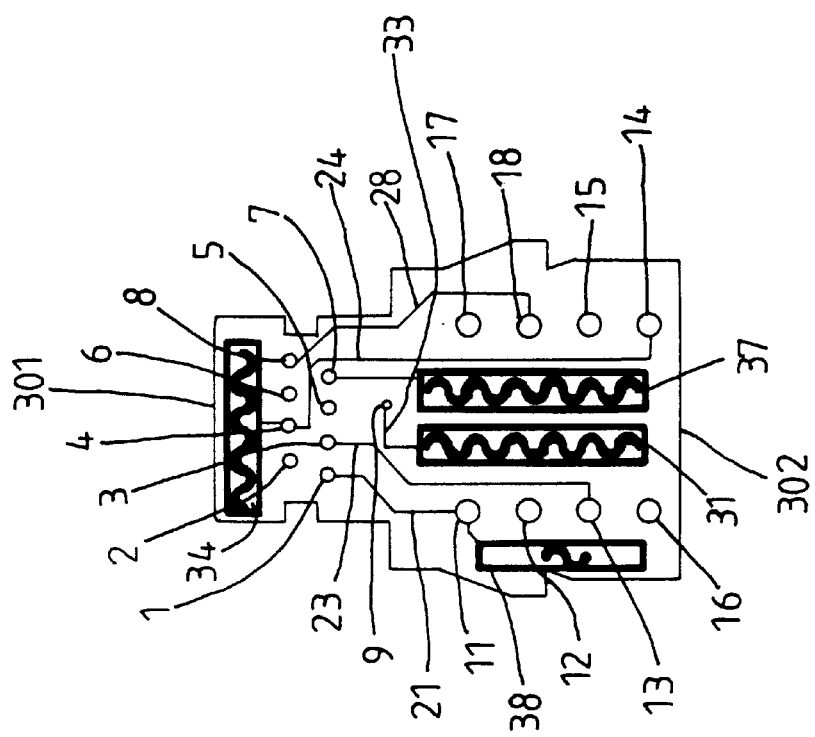
FIG. 7 illustrates the circuit arrangement at the second side of the base circuit board according to the second embodiment of the present invention.
Figure 6:
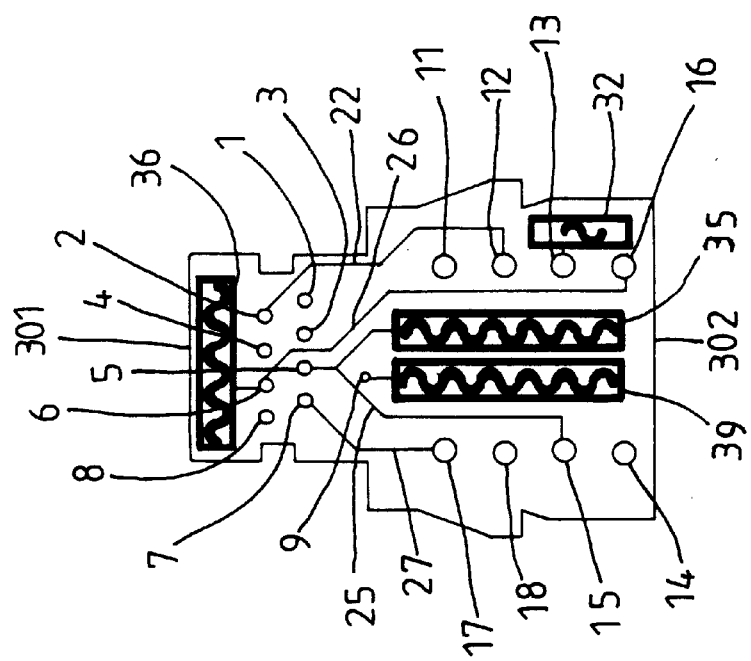
FIG. 6 illustrates the circuit arrangement at the first side of the base circuit board according to the second embodiment of the present invention.

FIGS. 6 and 7 show an alternate form of the base circuit board 10. According to this alternate form, the base circuit board 10 comprises a front part 301, a rear part 302, a first side 300, and a second side 400, an auxiliary metal contact hole 9 on the middle between the front part 301 and the rear part 302, two transverse rows of metal contact holes 1, 3, 5, 7,; 2, 4, 6, 8 arranged on the front part 301 and extended through the first side 300 and the second side 400, two longitudianl rows of metal contact holes 11, 12, 13, 16; 17, 18, 15, 14 arrangement on the rear part 302 and extended through the first side 300 and the second side 400, and a plurality of conductors 21, 22, 23, 24, 25, 26, 27, and 28 and a plurality of sine wave circuits 31, 32, 33, 34, 35, 36, 37, 38 and 39. The conductors 22, 25, 26, and 27 are printed on the first side 300. The conductors 21, 23, 24, and 28 are printed on the second side 400. The conductor 21 is connected between the by metal contact hole 1 and the metal contact 11. The conductor 22 is connected between the metal contact hole 2 and the metal contact 12. The conductor 23 is connected between the metal contact hole 3 and the metal contact 13. The conductor 24 is connected between the metal contact hole 4 and the metal contact 14. The conductor 25 is connected between the metal contact hole 5 and the metal contact 15. The conductor 26 is connected between the metal contact hole 6 and the metal contact 16. The conductor 27 is connected between the metal contact hole 7 and the metal contact 17. The conductor 28 is connected between the metal contact hole 8 and the metal contact 18. Further, the sine wave circuit 36 is disposed on the first side 300 of the base circuit board 10 and connected to the metal contact hole 6. The wave circuit 34 is disposed on the second side 400 and connected to the metal contact hole 4, and arranged in parallel to the sine wave circuit 36 to reinforce relative induction strength and noise preventive power. The metal contact hole 3 is electrically connected through the conductor 23 at the second side 400, the auxiliary metal contact hole 9, the sine wave circuit 39 at the first sdie 300, the metal contact hole 7, to the sine wave circuit 37 at the second side 400. The sine wave circuit 37 and the sine wave circuit 39 are arranged in parallel to reinforce relative induction strength and noise preventive power. The metal contact hole 5 is electrically connected through the sine wave circuit 35 at the first side 300 and the metal contact hole 3 to the sine wave circuit 31 at the second side 400. The sine wave circuit 31 and the sine wave circuit 35 are arranged in parallel to reinforce relative induction strength and noise preventive power. The metal contact hole 13 is electrically connected through the sine wave circuit 32 at the first side 300 and the metal contact hole 11 to the sine wave circuit 38 at the second sdie 400. The sine wave circuit 32 and the sine wave circuit 38 are arranged in parallel to reinforce relative induction strength and noise preventive power.

As indicated above, the conductors and sine wave circuits are symmetrically arranged on the first side 300 and second side 400 of the base circuit board 10 to reinforce induction strength and noise preventive power.

What is claimed is:

1. An isolation displacement comprising a housing (40), a base circuit board (10) installed in said housing (40), a terminal holder (50) mounted on said base circuit board (10), and a set of terminals (60) respectively installed in said terminal holder (50) and inserted through said base circuit baord (10), wherein said base circuit board (10) comprises a front part (101), a rear part (102), a first side (100), and a second side (200), an auxiliary metal contact hole (9) on the middle between said front part (101) and said rear part (102), a plurality of metal contact holes (1)(2)(3)(4)(5)(6)(7)(8) and arranged into two transverse rows on said front part (101) and respectively extended through said first side (100) and said second side (200), a plurality of metal contact holes (11)(12)(13)(14)(15)(16)(17)(18) arranged into two longitudinal rows on said rear part (102) and respectively extended through said first side (100) and said second side (200), and a plurality of conductors (21)(22)(23)(24)(25)(26)(27)(28) conductors (22)(25)(26)(27) being arranged on said first side (100), conductors (21)(23)(24)(28) being arranged on said second side (200), conductor (21) being connected between metal contct hole (1) and metal contact hole (11), conductor (22) being connected between metal contact hole (2) and metal contact hole (12), conductor (23) being connected between metal contact hole (3) and metal contact hole (13), conductor (24) being connected between metal contact hole (4) and metal contact hole (14), conductor (25) being connected between metal contact hole (5) and metal contact hole (15), conductor (26) being connected between metal contact hole (6) and metal contact hole (16), conductor (27) being connected between metal contact hole (7) and metal contact hole (17), conductor (28) being connected between metal contact hole (8) and metal contact hole (18).

2. The isolation displacement connector of claim 1 wherein conductor (21) and conductor (22) are respectively disposed on said second side (200) and said first side (100) and arranged in parallel.

3. The isolation displacement connector of claim 1 wherein conductor (23) and conductor (26) are respectively disposed on said second side (200) and said first side (100) and arranged in parallel.

4. The isolation displacement connector of claim 1 wherein conductor (24) and conductor (25) are respectively disposed on said second side (200) and said first side (100) and arranged in parallel.

5. The isolation displacement connector of claim 1 wherein conductor (28) and conductor (27) are respectively disposed on said second side (200) and said first side (100) and arranged in parallel.

6. An isolation displacement comprising a housing (40), a base circuit board (10) installed in said housing (40), a terminal holder (50) mounted on said base circuit baord (10), and a set of terminals (60) respectively installed in said terminal holder (50) and inserted through said base circuit baord (10), wherein said base circuit board (10) comprises a front part (301), a rear part (302), a first side (300), and a second side (400), an auxiliary metal contact hole (9) on the middle between said front part (301) and said rear part (302), a plurality of metal contact holes (1)(2)(3)(4)(5)(6)(7)(8) and arranged into two transverse rows on said front part (101) and respectively extended through said first side (100) and said second side (200), a plurality of metal contact holes (11)(12)(13)(14)(15)(16)(17)(18) arranged into two longitudinal rows on said rear part (102) and respectively extended through said first side (100) and said second side (200), and a plurality of conductors (21)(22)(23)(24)(25)(26)(27)(28) and a plurality of sine wave circuits (31)(32)(33)(34)(35) (36)(37)(38)(39) respectively connected to said metal contact holes (11) (12)(13)(14)(15)(16)(17)(18) conductors (22) (25)(26) (27) being arranged on said first side (100), conductors (21)(23)(24)(28) being arranged on said second side (200), conductor (21) being connected between metal contact hole (1) and metal contact hole (11), conductor (22) being connected between metal contact hole (2) and metal contact hole (23), conductor (23) being connected between metal contact hole (3) and metal contact hole (13), conductor (24) being connected between metal contact hole (4) and metal contact hole (14), conductor (25) being connected between metal contact hole (5) and metal contact hole (15), conductor (26) being connected between metal contact hole (6) and metal contact hole (16), conductor (27) being connected between metal contact hole (7) and metal contact hole (17), conductor (28) being connected between metal contact hole (8) and metal contact hole (18).

7. The isolation displacement connector of claim 6 wherein sine wave circuit (36) is disposed on said first side (300) of said base circuit board (10) and connected to metal contact hole (6), and sine wave circuit (34) is disposed on said second side (400) in parallel to sine wave circuit (36) on said first side (300) and connected to metal contact hole (4).

8. The isolation displacement connector of claim 6 wherein sine wave circuit (37) and sine wave circuit (39) are respectively disposed on said second side (400) and said first side (300) and arranged in parallel, enabling metal contact hole (3) to be electrically connected through conductor (23) at said second side (400), said auxiliary metal contact hole (9), sine wave circuit (39) at said first side (300), metal contct hole (7), to sine wave circuit (37) at said second side (400).

9. The isolation displacement connector of claim 6 wherein sine wave circuit (31) and sine wave circuit (35) are respectively disposed on said second side (400) and said first side (300) and arranged in parallel, enabling metal contact hole (5) to be electrically connected through sine wave circuit (35) at said first side (300) and metal contct hole (3), to sine wave circuit (31) at said second side (400).

10. The isolation displacement connector of claim 6 wherein sine wave circuit (32) and sine wave circuit (38) are respectively disposed on said second side, (400) and said first side (300) and arranged in parallel, enabling metal contact hole (13) to be electrically connected through sine wave circuit (32) at said first side (300) and metal contct hole (11) to sine wave circuit (38) at said second side (400).

* * * * *